US011296652B1

(12) United States Patent
Jones

(10) Patent No.: US 11,296,652 B1
(45) Date of Patent: Apr. 5, 2022

(54) OSCILLATING CIRCUIT WITH DIFFERENTIAL VARACTOR CIRCUITS

(71) Applicant: QUALCOMM Incorporated, San Diego, CA (US)

(72) Inventor: Philip Jones, Cottenham (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/061,751

(22) Filed: Oct. 2, 2020

(51) Int. Cl.
    *H03B 5/12*     (2006.01)
    *H03F 3/24*     (2006.01)
    *H04B 1/40*     (2015.01)

(52) U.S. Cl.
    CPC .......... *H03B 5/1228* (2013.01); *H03F 3/245* (2013.01); *H04B 1/40* (2013.01); *H03B 2200/004* (2013.01); *H03F 2200/294* (2013.01); *H03F 2200/451* (2013.01)

(58) Field of Classification Search
    CPC ......... H03F 2200/294; H03F 2200/451; H03F 3/245; H04B 1/40; H03B 2200/004; H03B 5/1228

USPC ............ 331/167, 177 V, 2, 116 FE; 455/255, 455/196.1
See application file for complete search history.

(56) References Cited

U.S. PATENT DOCUMENTS

| 10,340,922 | B1* | 7/2019 | Chen | .................... | H03B 5/1215 |
| 2009/0091380 | A1* | 4/2009 | Min | .................... | H01L 27/0808 |
| | | | | | 327/586 |
| 2012/0169428 | A1* | 7/2012 | Maarefi | ................ | H03B 5/1228 |
| | | | | | 331/117 FE |

\* cited by examiner

*Primary Examiner* — Arnold M Kinkead
(74) *Attorney, Agent, or Firm* — Patterson+ Sheridan, L.L.P.

(57) ABSTRACT

Aspects of the present disclosure provide an oscillating circuit. An example oscillating circuitry generally includes a differential control pair comprising a first control node and a second control node. The oscillating circuit further includes a first voltage-controlled oscillator (VCO) comprising a first differential varactor circuit having a first positive control input coupled to the first control node and a first negative control input coupled to the second control node. The oscillating circuit also includes a second differential varactor circuit having a second positive control input coupled to the second control node and a second negative control input coupled to the first control node.

17 Claims, 5 Drawing Sheets

OSCILLATING CIRCUIT WITH DIFFERENTIAL VARACTOR CIRCUITS

BACKGROUND

Field of the Disclosure

Certain aspects of the present disclosure generally relate to electronic circuits and, more particularly, to an oscillating circuit implemented with two differential varactor circuits inverted with respect to one another.

Description of Related Art

In certain cases, a wireless communication device may include a radio frequency (RF) transceiver (also referred to as a radio frequency front-end) for transmitting and/or receiving RF signals. Wireless communication devices are widely deployed to provide various communication services such as telephony, video, data, messaging, broadcasts, and so on. Such wireless communication devices may transmit and/or receive RF signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., Wi-Fi), and the like.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include an oscillating circuit with a desirable frequency response across differential outputs of the oscillating circuit.

Certain aspects of the present disclosure provide an oscillating circuit. The oscillating circuit generally includes a differential control pair comprising a first control node and a second control node. The oscillating circuit further includes a first voltage-controlled oscillator (VCO) comprising a first differential varactor circuit having a first positive control input coupled to the first control node and a first negative control input coupled to the second control node. The oscillating circuit also includes a second differential varactor circuit having a second positive control input coupled to the second control node and a second negative control input coupled to the first control node.

Certain aspects of the present disclosure provide a radio frequency front-end (RFFE) integrated circuit (IC) comprising the oscillating circuit described herein. A transmit path or a receive path of the RFFE IC is coupled to the first VCO having the first differential varactor circuit.

Certain aspects of the present disclosure provide a method of generating an oscillating signal. The method generally includes applying a differential control signal to a differential control pair coupled to a first VCO comprising a first differential varactor circuit, the differential control pair comprising a first control node coupled to a first positive control input of the first differential varactor circuit and a second control node coupled to a first negative control input of the first differential varactor circuit. The method further includes generating the oscillating signal from the first VCO based on the differential control signal, wherein a frequency response of the first VCO is affected by a second differential varactor circuit having a second positive control input coupled to the second control node and a second negative control input coupled to the first control node.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to an oscillating circuit and a method of generating an oscillating signal, for example, with an oscillating circuit.

Generally speaking, differential circuit structures are favored due to improved immunity to interference (such as interference from a common-mode signal) and greater signal range. For example, various chips use a switched-mode power supply (SMPS) to convert a battery voltage to a lower voltage. The power supplies may produce noise that can interfere with various components, such as a phase-locked loop (PLL), and degrade performance. Differential structures can increase a signal range without increasing supply voltage, which is beneficial for certain semiconductor processes having lower voltage supplies.

As an example, a differentially tuned voltage-controlled oscillator (VCO) allows for a differential PLL, which provides improved immunity to interference and a greater signal range. In aspects, a passive filter in the PLL can be made with half the capacitance of an equivalent single-ended design. A differentially tuned VCO may employ a differential varactor circuit as the control input to adjust the frequency of the VCO. A differential varactor circuit may use metal-oxide-semiconductor field-effect transistor (MOSFET) or junction varactors. The MOSFET varactors may be n-type metal-oxide-semiconductor (NMO S) or p-type metal-oxide-semiconductor (PMOS) varactors.

Figure 4A:
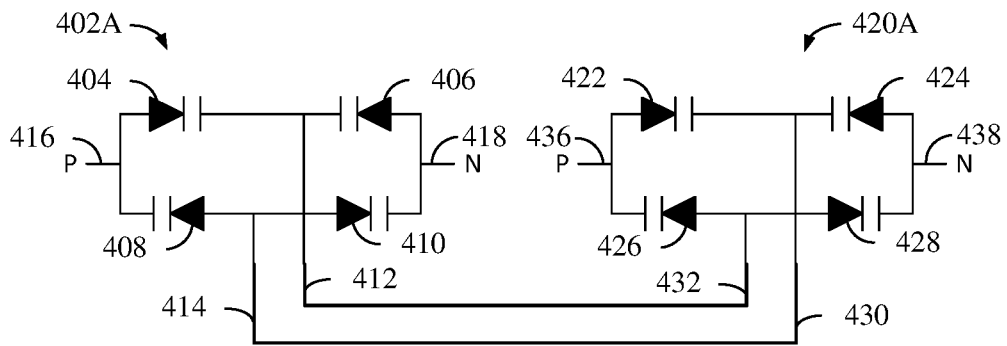
FIGS. 4A-4C are schematic diagrams of example differential varactor circuits coupled anti-parallel to one another, in accordance with certain aspects of the present disclosure.
Figure 4B:
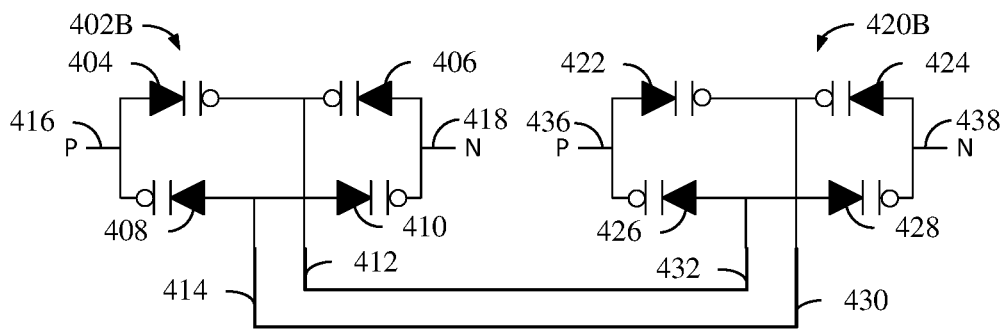
Figure 4C:
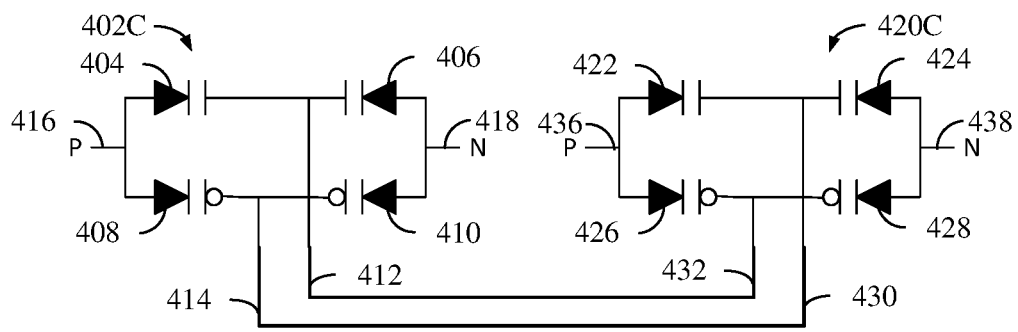

A differential varactor can be made by flipping the connections of the varactors (for example, as described herein with respect to FIGS. 4A and 4B) or by using complementary varactor types (NMOS and PMOS) (for example, as described herein with respect to FIG. 4C). In the case of an NMOS/PMOS structure, one differential input connects to a PMOS gate while the other differential input connects to an NMOS gate. In the case of a flipped varactor structure, one differential input drives a gate while the other differential input drives a well.

As such, the differential inputs of the varactor circuit are not identical, which may result in various performance issues. For example, leakage currents may be different for each of the differential inputs due to different leakage current into well connections than gate connections or different gate oxide leakage between NMOS and PMOS devices. In certain cases, the capacitance may be different for each of the differential inputs. For instance, capacitance may not be the same for different varactor types or different varactor connections (gate versus well). As a result, control input capacitance may influence the frequency response of loop. For example, the differing leakage currents and/or input capacitances may result in differing frequency responses on the output polarities, which may lead to a common-mode signal leaking through the differential varactor circuit at certain frequencies. In certain cases, an intermediate frequency (IF) or crystal reference frequency may be within the frequency range where the common-mode signal can leak through the differential varactor, which may lead to degraded performance.

Certain aspects of the present disclosure relate to an oscillating circuit with differential varactor circuits coupled anti-parallel with respect to one another, such that corresponding polarities are inverted. For example, the oscillating circuit may have a differential control pair where the inputs of a pair of differential varactor circuits are coupled to the differential control pair in an inverted scheme with respect to one another. As an example, an NMOS input of a first differential varactor circuit may be coupled to a PMOS input of a second differential varactor circuit, and the PMOS input of the first differential varactor circuit may be coupled to the NMOS input of the second differential varactor circuit.

In certain cases, wireless communication devices may have multiple VCOs, such as a VCO for a transmit (TX) path and another VCO for a receive (RX) path. Assuming the PLL filter is shared between the TX and RX paths, the tune controls of the VCOs may be connected together, as further described herein with respect to FIG. 3. The differential varactor circuits from the two VCO may be coupled in anti-parallel such that one varactor circuit is inverted relative to the other varactor circuit. The inverted parallel connections of the differential varactor circuits as further described herein may balance or at least adjust the differing leakage currents and/or input capacitances of the differential varactor circuits, such that the differential control may be symmetrical. In certain cases, the inverted parallel connections of the differential varactor circuits may provide a desirable frequency response from the differential varactor circuits without an interfering common-mode signal at certain frequency ranges, such as the IF or crystal reference frequency.

In certain aspects, a wireless communication device may employ a single VCO. In such a case, the transceiver circuit may be equipped with a dummy varactor circuit to provide the symmetry at the control inputs as further described herein.

Example RF Transceiver

Figure 1:
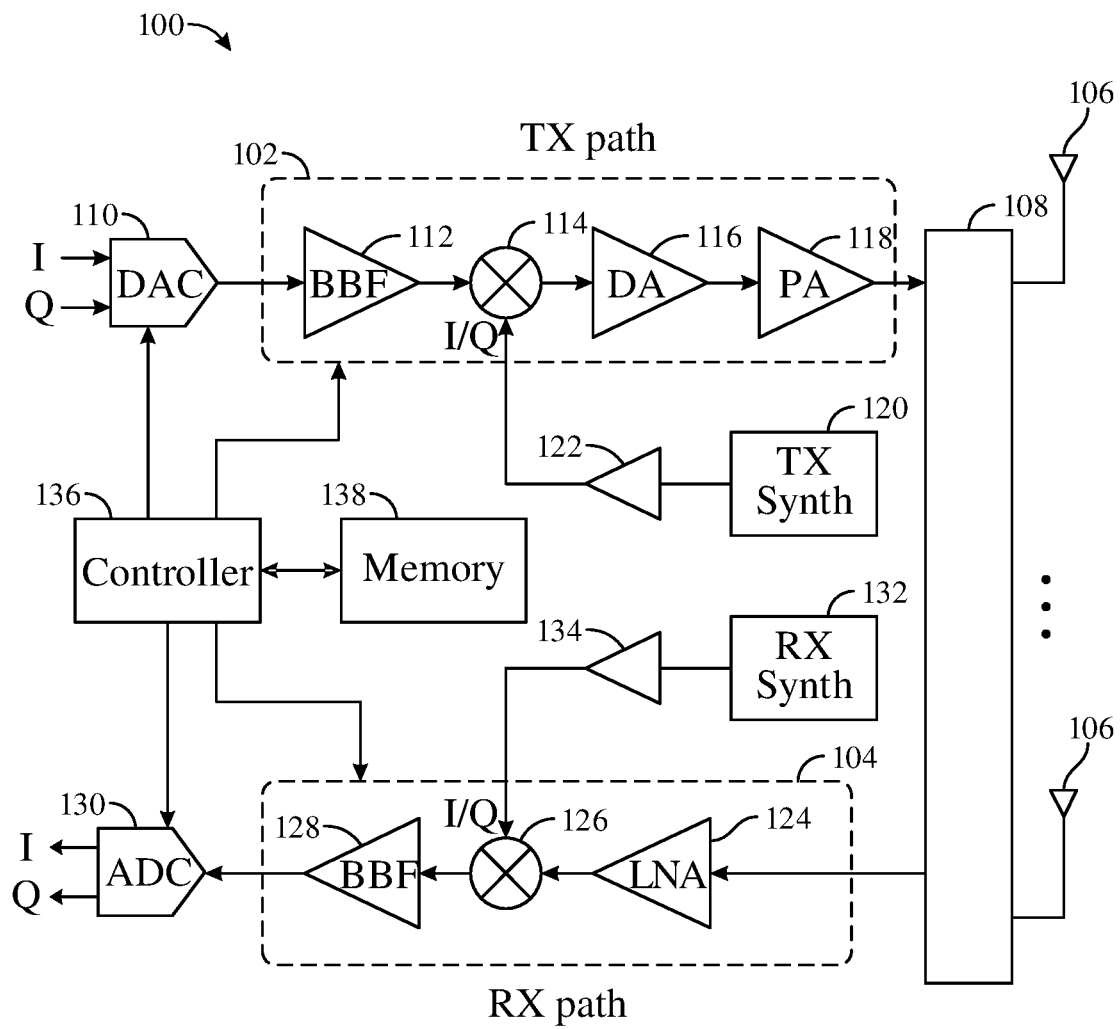
FIG. 1 is a block diagram of an example radio frequency transceiver, in accordance with certain aspects of the present disclosure.

FIG. 1 is a block diagram of an example RF transceiver circuit 100, in accordance with certain aspects of the present disclosure. The RF transceiver circuit 100 includes at least one transmit (TX) path 102 (also known as a transmit chain) for transmitting signals via one or more antennas 106 and at least one receive (RX) path 104 (also known as a receive chain) for receiving signals via the antennas 106. When the TX path 102 and the RX path 104 share an antenna 106, the paths may be connected with the antenna via an interface 108, which may include any of various suitable RF devices, such as a switch, a duplexer, a diplexer, a multiplexer, and the like.

Receiving in-phase (I) or quadrature (Q) baseband analog signals from a digital-to-analog converter (DAC) 110, the TX path 102 may include a baseband filter (BBF) 112, a mixer 114, a driver amplifier (DA) 116, and a power amplifier (PA) 118. The BBF 112, the mixer 114, the DA 116, and the PA 118 may be included in a radio frequency integrated circuit (RFIC).

The BBF 112 filters the baseband signals received from the DAC 110, and the mixer 114 mixes the filtered baseband signals with a transmit local oscillator (LO) signal to convert the baseband signal of interest to a different frequency (e.g., upconvert from baseband to a radio frequency). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 114 are typically RF signals, which may be amplified by the DA 116 and/or by the PA 118 before transmission by the antenna 106.

The RX path 104 may include a low noise amplifier (LNA) 124, a mixer 126, and a baseband filter (BBF) 128. The LNA 124, the mixer 126, and the BBF 128 may be included in a RFIC, which may or may not be the same RFIC that includes the TX path components. RF signals received via the antenna 106 may be amplified by the LNA 124, and the mixer 126 mixes the amplified RF signals with a receive local oscillator (LO) signal to convert the RF signal of interest to a different baseband frequency (e.g., downconvert). The baseband signals output by the mixer 126 may be filtered by the BBF 128 before being converted by an analog-to-digital converter (ADC) 130 to digital I or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 120, which may be buffered or amplified by amplifier 122 before being mixed with the baseband signals in the mixer 114. Similarly, the receive LO may be produced by an RX frequency synthesizer 132, which may be buffered or amplified by amplifier 134 before being mixed with the RF signals in the mixer 126. For certain aspects, a single frequency synthesizer may be used for both the TX path 102 and the RX path 104. In aspects, the TX frequency synthesizer 120 and/or RX frequency synthesizer 132 may include a frequency multiplier, such as a frequency doubler, that is driven by an oscillator (e.g., a VCO) in the frequency synthesizer. In certain cases, the VCO(s) of the TX frequency synthesizer 120 and/or RX frequency synthesizer 132 may have differential varactors coupled in anti-parallel as further described herein with respect to FIG. 3. The inverted parallel connections of the differential varactor circuits may facilitate a desirable frequency response from the differential varactor circuits.

A controller 136 may direct the operation of the RF transceiver circuit 100, such as transmitting signals via the TX path 102 and/or receiving signals via the RX path 104. The controller 136 may be a processor, a digital signal processor (DSP), an application specific integrated circuit (ASIC), a field programmable gate array (FPGA) or other programmable logic device (PLD), discrete gate or transistor logic, discrete hardware components, or any combination thereof. The memory 138 may store data and program codes for operating the RF transceiver circuit 100. The controller 136 and/or memory 138 may include control logic.

Figure 2:
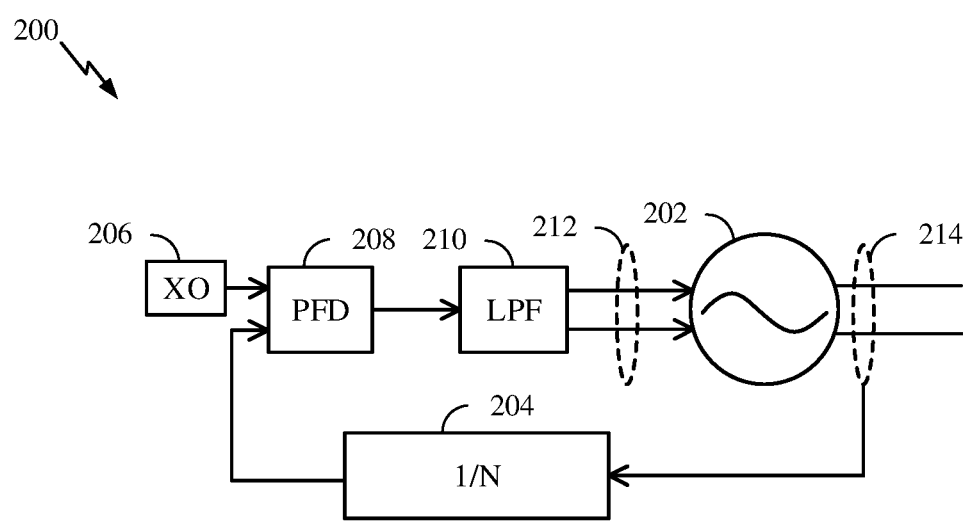
FIG. 2 is a block diagram of an example frequency synthesizer having a differentially tuned voltage-controlled oscillator, in accordance with certain aspects of the present disclosure.

FIG. 2 is a block diagram of an example frequency synthesizer 200, in accordance with certain aspects of the present disclosure. As shown, the frequency synthesizer 200 includes a differentially tuned VCO 202, a frequency divider 204, a reference oscillator 206, a phase frequency detector (PFD) 208, and a low-pass filter 210. The VCO 202 has a differential control pair 212 and a differential output pair 214. The VCO 202 includes an adjustable tuning element (not shown) such as a varactor diode or a differential varactor circuit as further described herein with respect to FIG. 3. The frequency divider 204 may downconvert or divide the differential output of the VCO 202 to a lower frequency. The PFD 208 compares the frequency and phase of the downconverted VCO output to the output of the reference oscillator 206. The PFD 208 outputs a current signal proportional to the error (e.g., difference) between the downconverted VCO output and the reference oscillator 206, and the low-pass filter 210 converts the PFD output to a control voltage signal, such as a differential control voltage applied to the control pair 212.

The feedback from the VCO 202 provides a phase-locked loop (PLL) circuit which tracks the error between the divided VCO output and the reference oscillator 206, such that the VCO output is locked to the frequency and phase of the reference oscillator 206. The frequency divider 204 enables the frequency synthesizer 200 to generate multiple output frequencies. For example, the frequency divider 204 may be a programmable counter which outputs a signal at various slower frequencies than the frequency of the VCO output. As the PFD 208 outputs a signal proportional to the error between the downconverted VCO output and reference oscillator 206, the VCO output may be a multiple of the reference oscillator 206.

While FIGS. 1 and 2 provide an RF transceiver and frequency synthesizer as an example application in which certain aspects of the present disclosure may be implemented to facilitate understanding, certain aspects described herein related to an oscillating circuit having a differential varactor circuit may be utilized in various other suitable electronic systems.

Example Oscillating Circuit

Figure 3:
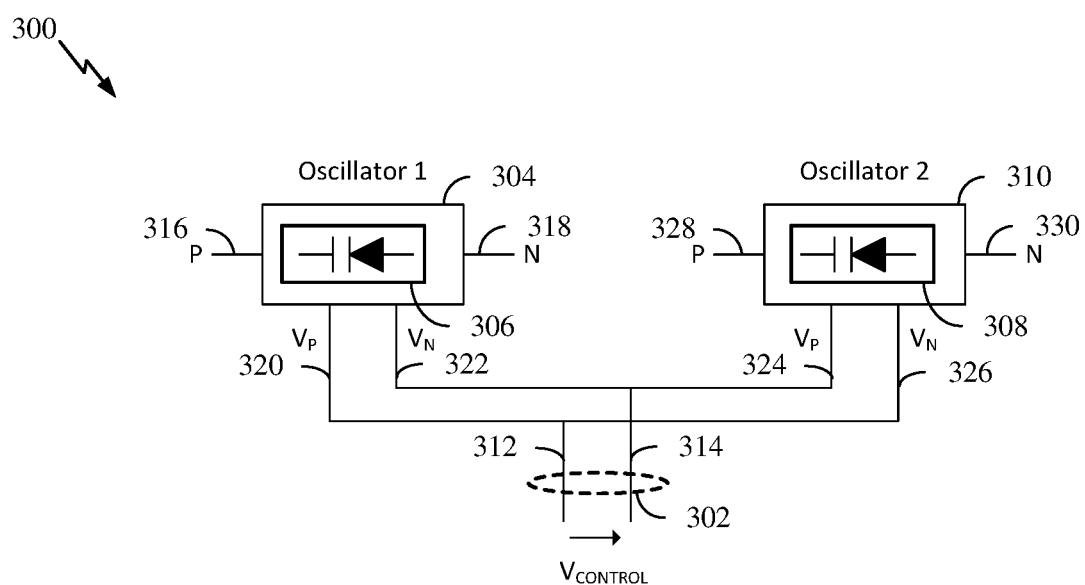
FIG. 3 is a block diagram of an example oscillating circuit with differential varactor circuits coupled anti-parallel to one another, in accordance with certain aspects of the present disclosure.

FIG. 3 is a block diagram of an oscillating circuit 300, in accordance with certain aspects of the present disclosure. As shown, the oscillating circuit 300 includes a differential control pair 302 and a first VCO 304, which includes a first differential varactor circuit 306. The oscillating circuit 300 also includes a second differential varactor circuit 308, which may be a stand-alone varactor circuit (e.g., a dummy varactor circuit without a corresponding VCO) or implemented in a second VCO 310 (for example, in cases where the first VCO 304 and second VCO 310 are coupled to a TX path and a RX path, respectively).

The differential control pair 302 includes a first control node 312 and a second control node 314. Control signals on the first and second control nodes 312, 314 may be used to adjust the frequency of the first VCO 304 and/or the second VCO 310. In certain aspects, the differential control pair 302 may be coupled to a low-pass filter (e.g., the low-pass filter 210) of a PLL frequency synthesizer, such as the frequency synthesizer 200.

The first VCO 304 is an electronic oscillator with an oscillation frequency that is controlled by an input voltage (namely, the control signals on the differential control pair 302). The first VCO 304 may have a differential output with a first positive output 316 and a first negative output 318. In this example, the first VCO 304 is a differentially tuned VCO, where the first differential varactor circuit 306 serves as a differential tuning element for the first VCO 304. That is, the first differential varactor circuit 306 provides a voltage-dependent capacitance, which is used to adjust the oscillation frequency of the first VCO 304. The first differential varactor circuit 306 may be implemented with complementary varactors (e.g., NMOS and PMOS varactors) or with inverted pairs of homogenous varactors, as further described herein with respect to FIGS. 4A-4C.

The first differential varactor circuit 306 includes a first positive control input 320 (labeled "$V_P$") coupled to the first control node 312 and a first negative control input 322 (labeled "$V_N$") coupled to the second control node 314. The first positive and negative control inputs 320, 322 of the first differential varactor circuit 306 are differential tuning inputs of the first VCO 304.

The second differential varactor circuit 308 may be a dummy varactor circuit without a corresponding VCO. In such a case, the second differential varactor circuit 308 may serve solely as a circuit that balances or adjusts the frequency response of the differential outputs of the first differential varactor circuit 306. In other cases, the second differential varactor circuit 308 may be implemented in the second VCO 310, such that the second differential varactor circuit 308 may serve as a differential tuning element of the second VCO 310, as well as a circuit that balances or adjusts the frequency response of the differential outputs of the first differential varactor circuit 306. Similarly, the first differential varactor circuit 306 may serve as a circuit that balances or adjusts the frequency response of the differential outputs of the second differential varactor circuit 308.

The second differential varactor circuit 308 may be implemented with complementary varactors or with inverted pairs of homogenous varactors. In certain cases, the second differential varactor circuit 308 may use the same varactor structure as the first differential varactor circuit 306. For example, the first differential varactor circuit 306 and the second differential varactor circuit 308 may both include complementary varactors (e.g., NMOS and PMOS varactors), and the second differential varactor circuit 308 may include complementary varactors. In other cases, the first and second differential varactor circuits comprise homogenous varactors (e.g., all NMOS varactors).

The second differential varactor circuit 308 includes a second positive control input 324 coupled to the second control node 314 and a second negative control input 326 coupled to the first control node 312. Expressed another way, the first differential varactor circuit 306 and second differential varactor circuit 308 are coupled in parallel at the control pair 302 with inverted polarities. That is, the first positive control input 320 of the first differential varactor circuit 306 is coupled to the second negative control input 326 of the second differential varactor circuit 308, and the first negative control input 322 of the first differential varactor circuit 306 is coupled to the second positive control input 324 of the second differential varactor circuit 308.

The second VCO 310 may have a differential output with a second positive output 328 and a second negative output 330. The second VCO 310 may be a differentially tuned VCO, where the second differential varactor circuit 308 serves as a differential tuning element for the second VCO 310. The second positive and negative control inputs 324, 326 of the second differential varactor circuit 308 may be differential tuning inputs of the second VCO 310.

In certain aspects, an RFIC (such as an RF front-end (RFFE) IC or an RF transceiver IC) may include the oscillating circuit 300. For example, an RF transceiver may include an RF synthesizer, which employs the oscillating circuit 300 as a differentially tuned oscillator. In certain aspects, a TX path or a RX path of the RFIC may be coupled to the first VCO 304 having the first differential varactor circuit 306. That is, the differential outputs of the first VCO 304 may be coupled to a TX path or a RX path of an RF transceiver circuit. In certain cases, the RFIC may further include the second VCO 310, where the TX path of the RFIC is coupled to the first VCO 304, and the RX path is coupled to the second VCO 310. For example, the differential outputs of the first VCO 304 may be coupled to the TX path of an RF transceiver circuit, whereas the differential outputs of the second VCO 310 may be coupled to the RX path of the RF transceiver circuit, or vice versa.

In certain aspects, the differential varactor circuits may include inverted pairs of homogenous varactors. FIG. 4A is a schematic diagram of example differential varactor circuits coupled anti-parallel to one another and implemented with NMOS varactors, in accordance with certain aspects of the present disclosure. As shown, the first differential varactor circuit 402A includes a first varactor 404, a second varactor 406, a third varactor 408, and a fourth varactor 410, each of which is an NMOS varactor. The first negative control input 412 of the first differential varactor circuit 402A is coupled between well connections of the first varactor 404 and the second varactor 406. The first positive control input 414 of the first differential varactor circuit 402A is coupled between gate connections of the third varactor 408 and the fourth varactor 410. The first differential varactor circuit 402A has differential outputs with a first positive output 416 and a first negative output 418.

The second differential varactor circuit 420A includes a fifth varactor 422, a sixth varactor 424, a seventh varactor 426, and an eighth varactor 428, each of which is an NMOS varactor. The second negative control input 430 of the second differential varactor circuit 420A is coupled between well connections of the fifth varactor 422 and the sixth varactor 424. The second positive control input 432 of the second differential varactor circuit 420A is coupled between gate connections of the seventh varactor 426 and the eighth varactor 428. The second differential varactor circuit 420A has differential outputs with a second positive output 436 and a second negative output 438.

FIG. 4B is a schematic diagram of example differential varactor circuits coupled anti-parallel to one another and implemented with PMOS varactors, in accordance with certain aspects of the present disclosure. As shown, the first differential varactor circuit 402B and the second differential varactor circuit 420B may have the same circuit configuration as depicted in FIG. 4A, except the varactors are PMOS varactors.

In certain cases, the positive and negative control inputs may be reversed. For example, the first negative control input 412 of the first differential varactor circuit 402A, 402B may be coupled between gate connections of the third varactor 408 and the fourth varactor 410, the first positive control input 414 of the first differential varactor circuit 402A, 402B may be coupled between well connections of the first varactor 404 and the second varactor 406, the second negative control input 430 of the second differential varactor circuit 420A, 420B may be coupled between gate connections of the seventh varactor 426 and the eighth varactor 428, and the second positive control input 432 of the second differential varactor circuit 420A, 420B may be coupled between well connections of the fifth varactor 422 and the sixth varactor 424.

In certain aspects, the differential varactor circuits may include complementary varactors. FIG. 4C is a schematic diagram of example differential varactor circuits coupled anti-parallel to one another and implemented with complementary varactors, in accordance with certain aspects of the present disclosure. As shown, the first varactor 404, the second varactor 406, the fifth varactor 422, and the sixth varactor 424 are NMOS varactors, whereas the third varactor 408, the fourth varactor 410, the seventh varactor 426, and the eighth varactor 428 are PMOS varactors. In this example, the first negative control input 412 of the first differential varactor circuit 402C is coupled between well connections of the first varactor 404 and the second varactor 406 (which are NMOS varactors), the first positive control input 414 of the first differential varactor circuit 402C is coupled between well connections of the third varactor 408 and the fourth varactor 410 (which are PMOS varactors), the second negative control input 430 of the second differential varactor circuit 420C is coupled between well connections of the fifth varactor 422 and the sixth varactor 424 (which are NMOS varactors), and the second positive control input 432 of the second differential varactor circuit 420C is coupled between well connections of the seventh varactor 426 and the eighth varactor 428 (which are PMOS varactors).

The inverted polarities of the differential varactor circuits (402A-C or 420A-C) coupled in parallel may balance or adjust the differing leakage currents and/or input capacitances of the differential varactor circuits, such that the frequency response of one of the differential varactor circuits is symmetrical or similar across the differential outputs. For example, suppose the first differential varactor circuit 402A is being used to tune the frequency output of a VCO (such as the first VCO 304). The gate connections of the seventh and eighth varactors 426, 428 may balance or adjust the differing leakage currents and/or input capacitances at the well connections of the first and second varactors 404, 406. Similarly, the well connections of the fifth and sixth varactors 422, 424 may balance or adjust the differing leakage currents and/or input capacitances at the gate connections of the third and fourth varactors 408, 410. In other words, the second differential varactor circuit may serve as a circuit that balances or adjusts the frequency response of the first differential varactor circuit, when the first differential varactor circuit is being used to tune the output frequency of a VCO, or vice versa.

Figure 5:
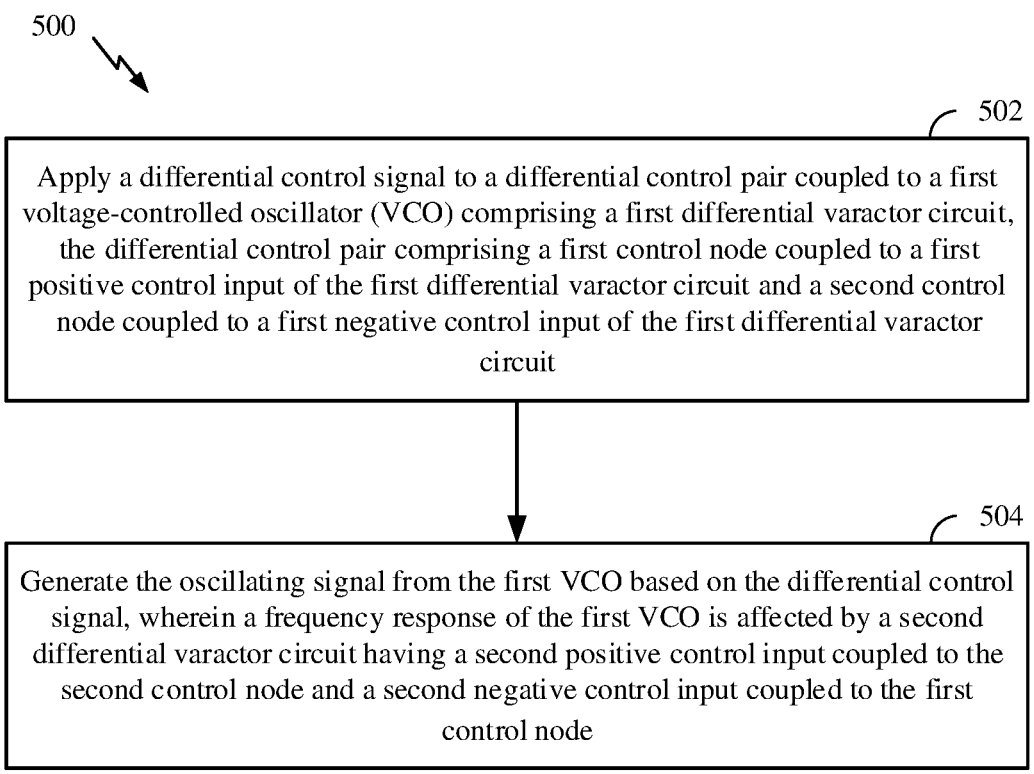
FIG. 5 is a flow diagram of example operations for generating an oscillating signal, in accordance with certain aspects of the present disclosure.

FIG. 5 is a flow diagram of example operations 500 for generating an oscillating signal, in accordance with certain aspects of the present disclosure. The operations 500 may be performed by an oscillating circuit, such as the oscillating circuit 300.

The operations 500 may begin at block 502, where a differential control signal is applied to a differential control pair (e.g., the differential control pair 302) coupled to a first voltage-controlled oscillator (VCO) (e.g., the first VCO 304) comprising a first differential varactor circuit (e.g., the first differential varactor circuit 306). The differential control pair includes a first control node (e.g., the first control node 312) coupled to a first positive control input (e.g., the first positive control input 320) of the first differential varactor circuit and a second control node (e.g., the second control node 314) coupled to a first negative control input (e.g., the first negative control input 322) of the first differential varactor circuit. At block 504, the oscillating signal is generated from the first VCO based on the differential control signal, where a frequency response of the first VCO is affected by a second differential varactor circuit (e.g., the second differential varactor circuit 308) having a second positive control input (e.g., the second positive control input 324) coupled to the second control node and a second negative control input (e.g., the second negative control input 326) coupled to the first control node.

In certain cases, the second differential varactor circuit may provide a balanced or desirable frequency response at both differential outputs of the first differential varactor circuit. For example, the frequency responses may be identical at both differential outputs of the first differential varactor circuit. In other words, the frequency response of the first differential varactor circuit (such as the frequency response at each of the differential outputs) is affected by the second differential varactor circuit, such that variations between the frequency responses of the differential outputs of the first differential varactor circuit are negligible or reduced. In certain cases, the second differential varactor circuit may also facilitate suppression of the common-mode signal, for example, at a desirable level (e.g., <−80 dB) to prevent or reduce interference from the common-mode signal on the differential outputs of the first differential varactor circuit. In other words, the frequency response of the first differential varactor circuit (such as the frequency response at each of the differential outputs) is affected by the second differential varactor circuit, such that the frequency response of the common-mode signal across the differential outputs of the first differential varactor circuit is suppressed or reduced.

In certain aspects, the first differential varactor circuit may be a tuning element of the first VCO. For example, applying the differential control signal at block 502 may include differentially tuning the first VCO, such as in a PLL circuit as described herein with respect to FIG. 2.

In certain aspects, the second differential varactor circuit may be included in a second VCO. In certain cases, applying the differential control signal at block 502 may include differentially tuning the second VCO. The operations 500 may further include generating another oscillating signal from the second VCO based on the differential control signal, where a frequency response of the second VCO is affected by the first differential varactor circuit.

Based on the present disclosure, it should be appreciated that the oscillating circuit described herein may enable a desirable frequency response from the differential varactor circuits without an interfering common-mode signal at certain frequency ranges, such as the IF or crystal reference frequency (e.g., the reference oscillator 206).

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An oscillating circuit, comprising:
a differential control node pair comprising a first control node and a second control node;
a first voltage-controlled oscillator (VCO) comprising a first differential varactor circuit having a first positive control input coupled to the first control node and a first negative control input coupled to the second control node; and
a second VCO comprising a second differential varactor circuit having a second positive control input coupled to the second control node and a second negative control input coupled to the first control node.

2. The oscillating circuit of claim 1, wherein the first positive and negative control inputs of the first differential varactor circuit are differential tuning inputs of the first VCO.

3. The oscillating circuit of claim 1, wherein the second positive and negative control inputs of the second differential varactor circuit are differential tuning inputs of the second VCO.

4. The oscillating circuit of claim 1, wherein:
the first differential varactor circuit includes complementary varactors; and
the second differential varactor circuit includes complementary varactors.

5. The oscillating circuit of claim 1, wherein:
at least one of the first differential varactor circuit or the second differential varactor circuit comprises a first n-type metal-oxide-semiconductor (NMOS) varactor, a second NMOS varactor, a first p-type metal-oxide-semiconductor (PMOS) varactor, and a second PMOS varactor;
at least one of the first positive control input of the first differential varactor circuit or the second positive control input of the second differential varactor circuit is coupled between the first NMOS varactor and the second NMOS varactor; and
at least one of the first negative control input of the first differential varactor circuit or the second negative control input of the second differential varactor circuit is coupled between the first PMOS varactor and the second PMOS varactor.

6. The oscillating circuit of claim 1, wherein:
at least one of the first differential varactor circuit or the second differential varactor circuit comprises a first NMOS varactor, a second NMOS varactor, a first PMOS varactor, and a second PMOS varactor;
at least one of the first positive control input of the first differential varactor circuit or the second positive control input of the second differential varactor circuit is coupled between the first PMOS varactor and the second PMOS varactor; and
at least one of the first negative control input of the first differential varactor circuit or the second negative control input of the second differential varactor circuit is coupled between the first NMOS varactor and the second NMOS varactor.

7. The oscillating circuit of claim 1, wherein the first and second differential varactor circuits comprise a same type of varactor circuit.

8. The oscillating circuit of claim 7, wherein:
the first differential varactor circuit includes a first varactor, a second varactor, a third varactor, and a fourth varactor;
the second differential varactor circuit includes a fifth varactor, a sixth varactor, a seventh varactor, and an eighth varactor;
the first positive control input of the first differential varactor circuit is coupled between well connections of the first varactor and the second varactor;
the first negative control input of the first differential varactor circuit is coupled between gate connections of the third varactor and the fourth varactor;
the second positive control input of the second differential varactor circuit is coupled between well connections of the fifth varactor and the sixth varactor; and
the second negative control input of the second differential varactor circuit is coupled between gate connections of the seventh varactor and the eighth varactor.

9. The oscillating circuit of claim 7, wherein:
the first differential varactor circuit includes a first varactor, a second varactor, a third varactor, and a fourth varactor;
the second differential varactor circuit includes a fifth varactor, a sixth varactor, a seventh varactor, and an eighth varactor;
the first positive control input of the first differential varactor circuit is coupled between gate connections of the first varactor and the second varactor;
the first negative control input of the first differential varactor circuit is coupled between well connections of the third varactor and the fourth varactor;
the second positive control input of the second differential varactor circuit is coupled between gate connections of the fifth varactor and the sixth varactor; and
the second negative control input of the second differential varactor circuit is coupled between well connections of the seventh varactor and the eighth varactor.

10. The oscillating circuit of claim 1, wherein:
at least one of the first differential varactor circuit or the second differential varactor circuit comprises a first NMOS varactor, a second NMOS varactor, a third NMOS varactor, and a fourth NMOS varactor;
at least one of the first positive control input of the first differential varactor circuit or the second positive control input of the second differential varactor circuit is coupled between the first NMOS varactor and the second NMOS varactor; and
at least one of the first negative control input of the first differential varactor circuit or the second negative control input of the second differential varactor circuit is coupled between the third NMOS varactor and the fourth NMOS varactor.

11. The oscillating circuit of claim 1, wherein:
at least one of the first differential varactor circuit or the second differential varactor circuit comprises a first PMOS varactor, a second PMOS varactor, a third PMOS varactor, and a fourth PMOS varactor;
at least one of the first positive control input of the first differential varactor circuit or the second positive control input of the second differential varactor circuit is coupled between the first PMOS varactor and the second PMOS varactor; and
at least one of the first negative control input of the first differential varactor circuit or the second negative control input of the second differential varactor circuit is coupled between the third PMOS varactor and the fourth PMOS varactor.

12. A radio frequency front-end (RFFE) integrated circuit (IC) comprising the oscillating circuit of claim 1, wherein a transmit path or a receive path of the RFFE IC is coupled to the first VCO having the first differential varactor circuit.

13. The RFFE IC of claim 12, wherein the transmit path of the RFFE IC is coupled to the first VCO and wherein the receive path is coupled to the second VCO.

14. A method of generating an oscillating signal, comprising:
applying a differential control signal to a differential control node pair coupled to a first voltage-controlled oscillator (VCO) comprising a first differential varactor circuit, the differential control node pair comprising a first control node coupled to a first positive control input of the first differential varactor circuit and a second control node coupled to a first negative control input of the first differential varactor circuit; and generating the oscillating signal from the first VCO based on the differential control signal, wherein a frequency response of the first VCO is affected by a second differential varactor circuit having a second positive control input coupled to the second control node and a second negative control input coupled to the first control node and wherein applying the differential control signal comprises differentially tuning a second VCO comprising the second differential varactor circuit.

15. The method of claim 14, wherein applying the differential control signal comprises differentially tuning the first VCO.

16. The method of claim 14, wherein:

applying the differential control signal comprises differentially tuning a second VCO comprising the second differential varactor circuit; and the method further comprises generating another oscillating signal from the second VCO based on the differential control signal, wherein a frequency response of the second VCO is affected by the first differential varactor circuit.

17. The method of claim 14, wherein the first and second differential varactor circuits comprise a same type of varactor circuit.

* * * * *